United States Patent [19]
Rhee

[11] 3,764,917
[45] Oct. 9, 1973

[54] AUTOMATIC FREQUENCY CONTROL CIRCUIT

[75] Inventor: Dong Woo Rhee, Williamsville, N.Y.
[73] Assignee: GTE Sylvania Incorporated, Seneca Falls, N.Y.

[22] Filed: June 29, 1972
[21] Appl. No.: 267,625

Related U.S. Application Data
[63] Continuation of Ser. No. 857,996, Sept. 15, 1969.

[52] U.S. Cl. ................. 325/423, 307/237, 325/420, 325/346, 329/178, 331/183
[51] Int. Cl. ............................................ H04b 1/16
[58] Field of Search .................................................... 325/416–423, 346–348; 329/136, 178, 179, 122; 331/176, 182, 183; 307/237; 178/DIG. 26

[56] References Cited
UNITED STATES PATENTS
2,831,106 4/1958 Clark .................................. 325/346
3,451,012 6/1969 Spiro.................................. 331/183

*Primary Examiner*—Albert J. Mayer
*Attorney*—Norman J. O'Malley et al.

[57] ABSTRACT

Automatic frequency control (AFC) circuitry includes a signal mixing means for deriving a difference signal from intercepted and locally developed signals, detecting means responsive to said difference signal to provide an output error signal, and a limiting means restricting the output error signal feed back to a locally developed signal means whereby the pull-in and hold-in ranges of the AFC system are controlled by the limiting means and manual switching to enhance station selection is rendered unnecessary.

5 Claims, 5 Drawing Figures

AUTOMATIC FREQUENCY CONTROL CIRCUIT

CROSS-REFERENCE TO RELATED APPLICATION

This application is a Continuation application of Ser. No. 857,996 filed Sept. 15, 1969, now abandoned, Dong Woo Rhee, and assigned to the same assignee as the present invention.

BACKGROUND OF THE INVENTION

Present day frequency modulation (FM) receivers and television receivers normally include some form of automatic frequency control (AFC) system whereby compensation for undesired tuning variations is provided. Usually, the AFC system is of the closed loop type wherein a received signal and a carrier signal developed by a voltage controlled oscillator are combined in a mixer stage to provide a difference signal.

This difference signal is applied to a tuned intermediate frequency (IF) amplifier stage and the deviation of the difference signal carrier frequency from the tuned frequency of the IF amplifier stage is detected to provide a shift in detector DC output potential. This DC output potential shift is in accordance with the voltage and frequency characteristics of the detector stage and usually referred to as the so-called "S-curve" characteristic. The detector output signal is integrated in an AFC loop filter which eliminates the AC components leaving only the shifted DC output signal. This shifted DC output signal in an error signal which is fed back to and controls the operation of the voltage controlled oscillator such that the output signal therefrom is altered in frequency to reduce the deviation of the difference signal carrier frequency from the tuned IF frequency and, in turn, reduce the error signal.

Although such AFC systems have been and still are widely employed in television and FM receivers, it has been found that such AFC systems do leave something to be desired. Factually, it has been found that receivers employing such AFC systems undesirably have received signal hold-in and pull-in ranges which are dependent not only upon the strength of the received signal but also upon the enablement and disablement of the AFC system.

More specifically, it has been found that a relatively strong received signal tends to cause signal clipping of a difference signal applied to an IF amplifier stage which, in turn, causes an increased bandwidth of the applied IF signal to provide an increased bandwidth of the "S-curve" characteristic. Thus, the hold-in and pull-in range of the receiver is dependent upon the strength of the received signal.

Further, it has been found that the normally negative feed-back characteristics of an AFC loop tend to cause a reduction in the slope of an error signal plotted in terms of volts per hertz. This reduced slope of the error signal provides an extended correction range of the deviation of the carrier frequency of the difference signal from the tuned frequency of the IF amplifier stage. As a result of this extended correction range or extended pull-in and hold-in ranges, the AFC system tends to render it impossible or at the very least inhibit selection of an adjacent station at a nearby frequency. Thus, the above-mentioned system undesirably requires inclusion of an AFC switch for disablement of the AFC system when station tuning is desired.

OBJECTS AND SUMMARY OF THE INVENTION

It is an object of the present invention to provide improved automatic frequency control (AFC) circuitry for a signal receiver. Another object of the invention is to provide improved AFC circuitry including apparatus for automatically limiting the pull-in and hold-in ranges of a receiver without disablement of the AFC system.

These and other objects, advantages and capabilities are achieved in one aspect of the invention by automatic frequency control (AFC) circuitry having means for receiving, means for developing, and means for mixing the received and developed signals to provide a difference signal. A tuned amplifier receives the difference signal, a detector indicates the deviation of the difference signal from the tuned frequency of the amplifier to provide an error signal, and a limiting means for controlling the magnitude of error signal coupled back to the signal developing means whereby the pull-in and hold-in ranges of the receiver are dependent upon the limiting means.

DESCRIPTION OF THE PREFERRED EMBODIMENT

For a better understanding of the present invention, together with other and further objects, advantages and capabilities thereof, reference is made to the following disclosure and appended claims in connection with the accompanying drawings.

Figures 1, 2, 3:
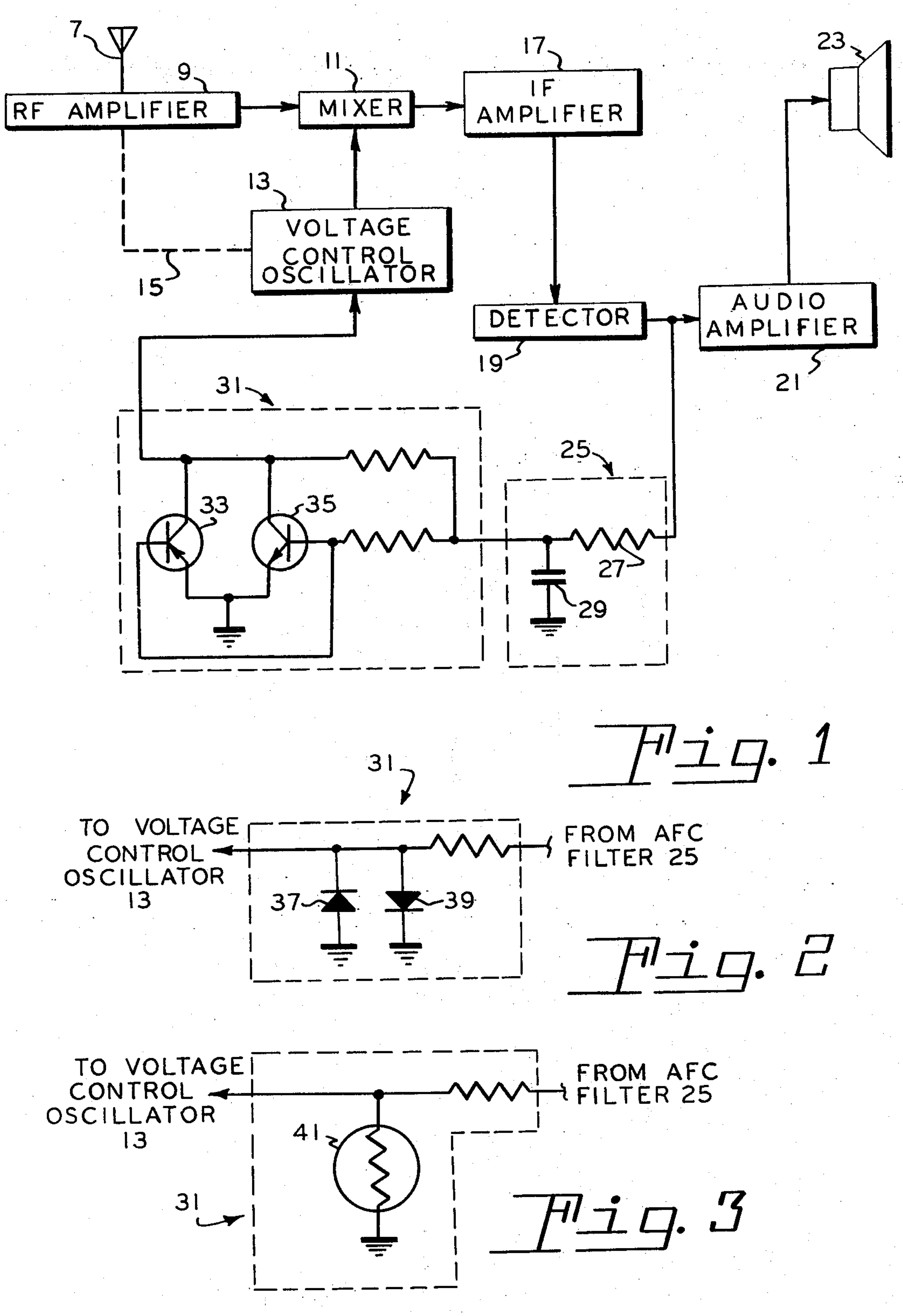
FIG. 1 illustrates, in block and schematic form, a signal receiver employing automatic frequency control (AFC) circuitry including a preferred form of signal limiting means.
FIGS. 2 and 3 illustrate alternate embodiments of a signal limiting means applicable to the AFC circuitry of FIG. 1.

Referring to the drawings, FIG. 1 illustrates a frequency modulated (FM) receiver suitable for illustrating a preferred form of automatic frequency control (AFC) circuitry. Obviously, television receivers and other apparatus are also applicable and appropriate so long as a closed loop type AFC circuitry is employed.

In FIG. 1, the FM receiver has an antenna 7 for intercepting transmitted FM signals and applying these intercepted signals to a radio frequency (RF) amplifier stage 9. The RF amplifier stage 9 intensifies the received FM signals and is coupled to a mixer stage 11. Also, a voltage controlled oscillator (VCO) 13 develops a carrier signal which is applied to the mixer stage 11. A mechanical or electrical coupling means 15 serves to facilitate tuning adjustments or station selection by the RF amplifier stage 9 and VCO 13.

The mixer stage 11 receives the FM signal from the RF amplifier stage 9 and a carrier signal from the voltage controlled oscillator (VCO) 13, and heterodynes these two signals to provide a resultant frequency difference signal which is applied to an intermediate frequency (IF) amplifier stage 17. The IF amplifier stage 17 is tuned to a given frequency, 10.6 mHz in a FM receiver for instance, and the applied frequency difference signals are amplified and frequency limited by the IF amplifier stage 17.

Figure 4:
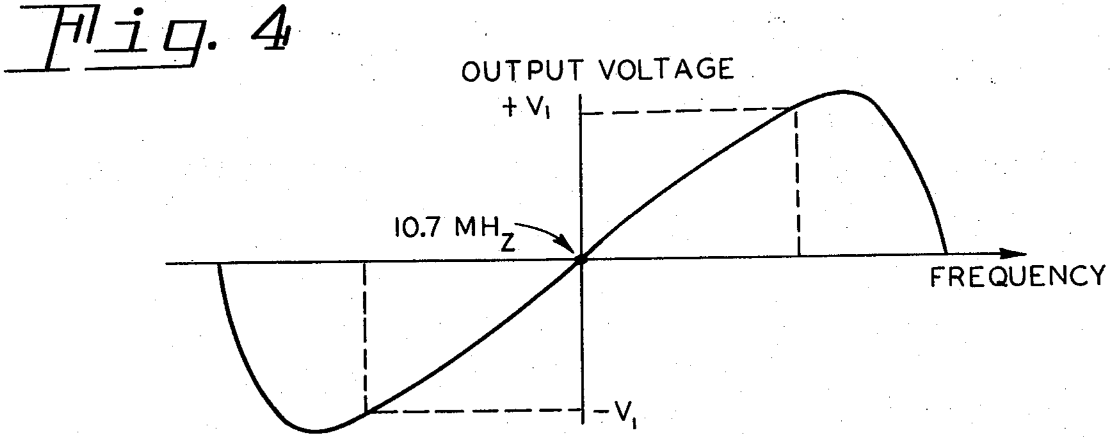
FIG. 4 illustrates a so-called characteristic or "S-curve" response of a signal detector stage.

The amplified frequency difference signal from the IF amplifier stage 17 is applied to a detector stage 19 which can be in any one of a number of forms, such as a frequency discriminator, phase lock loop detector, or pulse detector for example. The amplified frequency difference signal, which is a frequency modulated signal in the case of an FM receiver, is detected by the detector stage 19, having a characteristic substantially as illustrated in FIG. 4, to provide a modulated or audio signal. The audio signal is normally AC coupled to an audio amplifier stage 21, and in turn, to a loudspeaker 23.

Also, the output signal from the detector stage 19 is applied to an AFC loop filter 25 including a resistor 27 and a capacitor 29 coupled to a potential reference level such as circuit ground. Therein, the output signal from the detector stage 19 is integrated or averaged to provide an error signal in the form of a variable DC potential. Essentially, this error signal is an indication of the deviation of the frequency difference signal carrier frequency from the tuned frequency of the IF amplifier stage 17 in terms of the detector characteristics of the detector stage 19.

This variable DC potential error signal is fed back to the voltage controlled oscillator (VCO) 13 by way of a potential limiting means 31. In this particular embodiment, the potential limiting means 31 is in the form of a pair of complimentary transistors 33 and 35 respectively. These transistors 33 and 35 are parallel connected intermediate the DC intercoupled AFC loop filter 25 and voltage controlled oscillator (VCO) 13 and a potential reference level such as circuit ground.

Although the complimentary parallel coupled transistors 33 and 35 of FIG. 1 are a preferred embodiment, FIG. 2 illustrates an alternate but suitable embodiment including a pair of oppositely poled diodes 37 and 39 parallel coupled intermediate the junction of the AFC by loop filter 25 and voltage controlled oscillator (VCO) 13 and circuit ground. FIG. 3 illustrates still another embodiment of the potential limiting means 31 of FIG. 1 wherein a voltage dependent resist (VDR) 41 couples the junction of the AFC loop filter 25 and VCO 13 to circuit ground.

As to operation, adjustment of the tuning means 15 serves to select an incoming FM signal and cause development of a given carrier signal by the voltage controlled oscillator (VCO) 13. The received signal and the developed carrier signal are heterodyned in the mixer stage 11 to provide a frequency difference signal which is applied to the tuned IF amplifier stage 17.

The deviation in frequency of the frequency difference signal from the tuned frequency of the IF amplifier stage 17 is applied to the detector stage 19 having a characteristic or "S-curve" response substantially as illustrated in FIG. 4. As can readily be seen in the illustration of FIG. 4, a given magnitude of output potential from the detector stage 19, represented as $V_1$ and $-V_1$, is derived from the deviation of frequency of the frequency difference signal from the tuned IF frequency, 10.7 mHz in this instance, of the amplifier stage 17.

Figure 5:
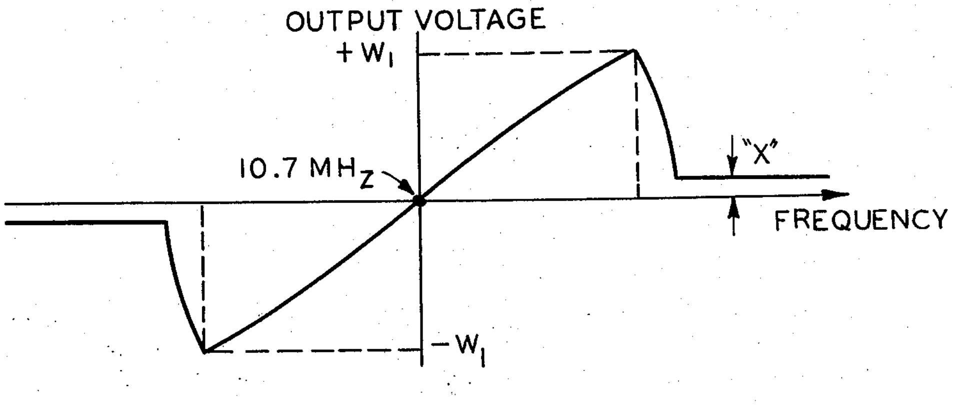
FIG. 5 is a curve illustrating the response of a signal limiting means to the characteristics of the detector stage of FIG. 4.

In turn, the output potential, $+V_1$ and $-V_1$, of the detector stage 19 is applied via the AFC loop filter 25 to the limiting means 31 having normally non-conductive transistors 33 and 35 and a characteristic curve substantially as illustrated in FIG. 5. As can be seen, application of the output potential, $+V_1$ and $-V_1$, from the detector stage 19 to the limiting means 31 provides an output potential therefrom which increases until conduction of one of the transistors 33 and 35 occurs, represented as $+W_1$ and $-W_1$, and which is applied to and varies the operation of the voltage controlled oscillator (VCO) 13.

It is to be noted the selected example illustrated in FIGS. 4 and 5 provides an output potential, $+V_1$ and $-V_1$, from the detector stage 19 which causes development of a maximum magnitude of output potential, $+W_1$ and $-W_1$, from the signal limiting means 31. Should the deviation in frequency of the frequency difference signal from the tuned IF amplifier stage 17 increase causing an increase in the output potential, $+V_1$ and $-V_1$, derived from the detector stage 19, the breakdown voltage of the base to emitter junction of the transistors 33 or 35 would be exceeded rendering one of the transistors 33 and 35 of the limiting means 31 conductive. Thereupon, the output potential or error signal, $+W_1$ and $-W_1$, applied to the voltage controlled oscillator (VCO) 13 is reduced to a value having a level "$x$" illustrated in FIG. 5.

Thus, it can be seen that the conductivity characteristics of the limiting means 31 serve to control the hold-in and pull-in ranges of the AFC circuitry whereas negative feedback potentials normally tend to undesirably vary the hold-in and pull-in ranges of AFC circuitry. Also, the limiting means 31 serves to automatically limit the hold-in and pull-in ranges of the AFC circuitry permitting elimination of the usual normal disablement switch means normally employed to inactivate the AFC system when an alternate station is to be selected. Moreover, the fixed pull-in and hold-in ranges provided by the limiting means in the improved AFC circuitry as opposed to extendable hold-in and pull-in ranges in other known AFC circuitry permits selection of adjacent stations even though the frequency increments therebetween are relatively small.

While there has been shown and described what is at present considered the preferred embodiments of the present invention, it will be obvious to those skilled in the art that various changes and modifications may be made therein without departing from the invention as defined in the appended claims.

What is claimed is:

1. Automatic frequency control (AFC) circuitry comprising: signal receiving means;

local signal generating source in the form of an oscillator;

signal mixing means coupled to said signal receiving means and said local signal generating source for deriving a frequency difference signal;

amplifier means coupled to said signal mixing means and tuned to a given frequency;

detector means coupled to said amplifier means and providing an output signal in response to deviations of the frequency of an applied signal from the tuned frequency of said amplifier means;

filtering means coupled to said detector means and responsive to said deviation in signal frequency for providing an error signal in the form of a DC potential; and limiting means including a pair of complimentary transistors parallel coupled to a potential reference level and to said filtering means and said local signal generating source, said limiting means DC coupling said filtering means to said local signal generating source said limiting means automatically responding to a given maximum magnitude of said error signal to render a substantial reduction in said AFC potential below said given maximum magnitude when the input to said limiting means exceeds said maximum magnitude whereby error correction to a nearby channel is prevented.

2. The AFC circuitry of claim 1 wherein said signal receiving means is responsive to frequency modulated (FM) signals.

3. The AFC circuitry of claim 1 wherein said limiting means includes an impedance DC coupling said filtering means to said local signal generating source.

4. The AFC circuitry of claim 1 wherein said limiting means includes a pair of complimentary transistors having emitter electrodes parallel coupled to a potential reference level, base electrodes parallel coupled to said filtering means, and collector electrodes parallel coupled to said local signal generating source and said filtering means.

5. The AFC circuitry of claim 3 wherein said impedance is in the form of a resistor.

* * * * *